United States Patent
Sullivan et al.

(10) Patent No.: US 12,149,259 B2
(45) Date of Patent: Nov. 19, 2024

(54) SINGLE-CYCLE BYTE CORRECTING AND MULTI-BYTE DETECTING ERROR CODE

(71) Applicant: NVIDIA Corporation, Santa Clara, CA (US)

(72) Inventors: Michael Brendan Sullivan, Austin, TX (US); Nirmal R. Saxena, Los Altos Hills, CA (US); Stephen William Keckler, Austin, TX (US)

(73) Assignee: NVIDIA Corporation, Santa Clara, CA (US)

( * ) Notice: Subject to any disclaimer, the term of this patent is extended or adjusted under 35 U.S.C. 154(b) by 0 days.

(21) Appl. No.: 17/934,163

(22) Filed: Sep. 21, 2022

(65) Prior Publication Data

US 2023/0089736 A1 Mar. 23, 2023

Related U.S. Application Data

(60) Provisional application No. 63/246,542, filed on Sep. 21, 2021.

(51) Int. Cl.
*G11C 29/00* (2006.01)
*H03M 13/00* (2006.01)
(Continued)

(52) U.S. Cl.
CPC ..... *H03M 13/098* (2013.01); *H03M 13/1515* (2013.01); *H03M 13/1575* (2013.01)

(58) Field of Classification Search
CPC ........... H03M 13/098; H03M 13/1515; H03M 13/1575
See application file for complete search history.

(56) References Cited

U.S. PATENT DOCUMENTS

| 5,754,562 | A  | * | 5/1998  | Chen   | H03M 13/151  |
|           |    |   |         |        | 714/763      |
| 6,470,471 | B1 | * | 10/2002 | Noguchi| H03M 13/1595 |
|           |    |   |         |        | 714/782      |
| 2007/0079226 | A1 | * | 4/2007 | Hoya   | G06F 11/1032 |
|           |    |   |         |        | 714/801      |

OTHER PUBLICATIONS

Katayama, Y., et al., "One-Shot Reed-Solomon Decoding for High-Performance Dependable Systems," in the International Conference on Dependable Systems and Networks (DSN), 2000, pp. 390-399.
(Continued)

*Primary Examiner* — Christine T. Tu
(74) *Attorney, Agent, or Firm* — Leydig, Voit & Mayer, Ltd.

(57) ABSTRACT

A memory device and a system that implements a single symbol correction, double symbol detection (SSC-DSD+) error correction scheme are provided. The scheme is implemented by calculating four syndrome symbols in accordance with a Reed-Solomon (RS) codeword; determining three location bytes in accordance with three corresponding pairs of syndrome symbols in the four syndrome symbols; and generating an output based on a comparison of the three location bytes. The output may include: corrected data responsive to determining that the three location bytes match; an indication of a detected-and-corrected error (DCE) responsive to determining that two of the three location bytes match; or an indication of a detected-yet-uncorrected error (DUE) responsive to determining that none of the three location bytes match. A variant of the SSC-DSD+ decoder may be implemented using a carry-free subtraction operation to perform sanity checking.

17 Claims, 6 Drawing Sheets

(51) Int. Cl.
H03M 13/09 (2006.01)
H03M 13/15 (2006.01)

(56) References Cited

OTHER PUBLICATIONS

Sullivan, M.B., et al., "Characterizing and Mitigating Soft Errors in GPU DRAM," In the International Symposium on Microarchitecture (MICRO), Oct. 2021.
Blythe, D., "The Xe GPU Architecture," In Proceedings of the Symposium on High Performance Chips (HOTCHIPS). (2012).
Borucki, L., et al., "Comparison of Accelerated DRAM Soft Error Rates Measured at Component and System Level," In Proceedings of the International Reliability Physics Symposium (IRPS) (2008). pp. 482-487.
Brown, D.T., "Error Detection and Correcting Binary Codes for Arithmetic Operations," IRE Transactions on Electric Computers EC-9, 3 (1960), pp. 333-337.
Caffrey, J.M., "The Resiliency Challenge Presented by Soft Failure Incidents," IBM Systems Journal 47 (2008), pp. 641-652 (Abstract).
Cazzaniga, C., et al., "Progress of the Scientific Commissioning of a Fast Neutron Beamline for Chip Irradiation," Journal of Physica: Conference Series 1021, 1 (May 2018).
Chen, H.M., et al., "RATT-ECC: Rate Adaptive Two-Tiered Error Correction Codes for Reliable 3D Die-Stacked Memory," ACM Transactions on Architecture and Code Optimization (TACO) 13, 3 (2016), 24:1-24:24.
Choquette, J., et al., "NVIDIA A100 GPU: Performance & Innovation for GPU Computing," In Proceedings of the Symposium on High Performance Chips (HOTCHIPS).
Chugg, A.M., et al., "The Random Telegraph Signal Behavior of Intermittently Stuck Bits in SDRAMs," IEEE Transactions on Nuclear Science 56, 6 (2009), 3057-3064.
Chugg, A.M., et al., "Probing the Nature of Intermittently Stuck Bits in Dynamic RAM Cells," IEEE Transactions on Nuclear Science 57, 6 (2010), pp. 3190-3198.
Dimartino, C.D., et al., "Lessons Learned from the Analysis of Systems Failures at Petascale: The Case of Blue Waters," In Proceedings of the International Conference on Dependable Systems and Networks (DSN) (2014).
Fernandes Dos Santos, F., et al., "Analyzing the Criticality of Transient Faults-Induced SDCS on GPU Applications," In Proceedings of the 8th Workshop on Latest Advances in Scalable Algorithms for Large-Scale Systems, 1:1-1:7. (2017).
Dutta, A., et al., "Multiple Bit Upset Tolerant Memory Using a Selective Cycle Avoidance Based SEC-DED-DAEC Code," In Proceedings of the VLSI Test Symposium (VTS), pp. 349-354. (2007).
Edmonds, L.D., et al., "Physical Mechanisms of Ion-Induced Stuck Bits in the Hyundai 16Mx4 SDRAM," IEEE Transactions on Nuclear Science 55, 6 (2008), pp. 3265-3271.
Findlay, DJS, "ISIS-Pulsed Neutron and Muon Source," In 2007 IEEE Particle Accelerator Conference (PAC), pp. 695-699. (2007).
Giridhar, B., et al., "Exploring DRAM Organizations for Energy-Efficient and Resilient Exascale Memories," In Proceedings of the International Conference on High Performance Computing, Networking, Storage and Analysis, pp. 1-12. (2013).
Gong, S.L., et al., "DUO: Exposing On-Chip Redundancy to Rank-Level ECC For High Reliability," In Proceedings of the International Symposium on High Performance Computer Architecture (HPCA), pp. 683-695. (2018).
Gong, S.L., et al., "Clean-ECC: High Reliability ECC for Adaptive Granularity Memory System," In Proceedings of the International Symposium on Microarchitecture (MICRO), pp. 611-622. (2015).
Hsiao, M.Y., "A Class of Optimal Minimum Odd-Weight col. SEC-DED Codes," IBM Journal of Research and Development 14, 4 (1970), pp. 395-401.
Jeon, H., et al., "Efficient RAS Support for 3D Die-Stacked DRAM," In Proceedings of the International Test Conference, pp. 1-10.

Jia, Z., et al., "Dissecting the NVIDIA Volta GPU Architecture via Microbenchmarking," arXiv preprint arXiv: 1804.06826 (2018).
Jian, X., et al., "Parity Helix: Efficient Protection for Single-Dimensional Faults in Multi-Dimensional Memory Systems," In Proceedings of the International Symposium on High Performance Computer Architecture (HPCA), pp. 555-567. (2016).
Jun, H., et al., "HBM (High Bandwidth Memory) DRAM Technology and Architecture," In Proceedings of the International Memory Workshop (IMW), pp. 1-4. (2017).
Katayama, Y., et al., "One-Shot Reed-Solomon Decoding for High-Performance Dependable Systems," In Proceedings of the International Conference on Dependable Systems and Networks (DSN), pp. 390-399. (2000).
Kim, J., et al., "Bamboo ECC: Strong, Safe, and Flexible Codes for Reliable Computer Memory," In Proceedings of the International Symposium on High Performance Computer Architecture (HPCA). (2015).
Kim, K., et al., "A New Investigation of Data Retention Time in Truly Nanoscaled DRAMs," IEEE Electron Device Letters 30, 8 (2009), pp. 846-848.
Levy, S., et al., "Lessons Learned from Memory Errors Observed Over the Lifetime of Cielo," In Proceedings of the International Conference on High Performance Computing, Networking, Storage and Analysis (SC), pp. 43:1-43:12.
Lim, C., et al., "Stuck Bits Study in DDR3 SDRAMs Using 45-MeV Proton Beam," IEEE Transactions on Nuclear Science 62, 2 (2015), pp. 520-526.
Lim, C., et al., "Active Precharge Hammering to Monitor Displacement Damage Using High-Energy Protons in 3x-nm SDRAM," IEEE Transactions on Nuclear Science 64, 2 (2017), pp. 859-866.
Lunardi, C., et al., "On the Efficacy of ECC and the Benefits of FinFET Transistor Layout for GPU Reliability," IEEE Transactions on Nuclear Science 65, 8 (2018), pp. 1843-1850.
Mappouras, G., et al., "Jenga: Comprehensive Fault Tolerance for Stacked DRAM," In Proceedings of the International Conference on Computer Design (ICCD), pp. 361-368. (2017).
Nair, P., et al., "Citadel: Efficiently Protecting Stacked Memory from TSV and Large Granularity Failures," ACM Transactions on Architecture and Code Optimization (TACO) 12, 4 (2016), pp. 49:1-49:24.
Nie, B., et al., "A Large-Scale Study of Soft-Errors on GPUs in the Field," In Proceedings of the International Symposium on High Performance Computer Architecture (HPCA), pp. 519-530. (2016).
Park, M., et al., "Soft Error Study on DDR4 SDRAMs Using a 480 MeV Proton Beam," In Proceedings of the International Reliability Physics Symposium (IRPS), SE-3.1-SE3.6. (2017).
Rhu, M., et al., "A Locality-Aware Memory Hierarchy for Energy-Efficient GPU Architectures," In Proceedings of the International Symposium on Microarchitecture (MICRO), pp. 86-98. (2013).
Rodriguez, A., et al., "TCAD Simulations of Leakage Currents Induced by SDRAM Single-Event Cell Degradation," In Proceedings of the European Conference on Radiation and Its Effects on Components and Systems (RADECS), pp. 1-5. (2016).
Slayman, C., "Soft Error Trends and Mitigation Techniques in Memory Devices," In Proceedings of the Reliability and Maintainability Symposium (RAMS), pp. 1-5. (2011).
Snir, M., et al., "Addressing Failures in Exascale Computing," The International Journal of High Performance Computing Applications 28, 2 (2014) pp. 129-173.
Sridharan, V., et al., "Memory Errors in Modern Systems: The Good, The Bad, and the Ugly," In Proceedings of the International Symposium on Architectural Support for Programming Languages and Operating Systems (ASPLOS), pp. 297-310.
Tiwari, D., et al., "Understanding GPU Errors on Large-Scale HPC Systems and the Implications for System Design and Operation," In Proceedings of the International Symposium on High Performance Computer Architecture (HPCA), op. 331-342.
Topper, A.D., et al., "Compendium of Current Total Ionizing Dose and Displacement Damage Results from NASA Goddard Space Flight Center and NASA Electronic Parts and Packaging Program," In IEEE Radiation Effects Data Workshop (REDW), pp. 1-11. (2017).

(56) References Cited

OTHER PUBLICATIONS

Zimmerman, R., "Efficient VLSI Implementation of Modulo Addition and Multiplication," In Proceedings of the IEEE Symposium on Computer Arithmetic, pp. 158-167.
Zulkifli, S.M., et al., "High-Res 3D X-Ray Microscopy for Non-Destructive Failure Analysis of Chip-to-Chip Micro-Bump Interconnects in Stacked Die Packages," In Proceedings of the International Symposium on Physical and Failure Analysis of Integrated Circuits (IPFA), pp. 1-5.
Choquette, J., et al., "NVIDIA A100 GPU: Performance & Innovation for GPU Computing," In Proceedings of the Symposium on High Performance Chips (HOTCHIPS), Aug. 16-18, 2020.
Jeon, H., et al., "Efficient RAS Support for 3D Die-Stacked DRAM," In Proceedings of the International Test Conference, pp. 1-10, Oct. 20-23, 2014.
Levy, S., et al., "Lessons Learned from Memory Errors Observed Over the Lifetime of Cielo," In Proceedings of the International Conference on High Performance Computing, Networking, Storage and Analysis (SC), pp. 43:1-43:12, Operational Life, Nov. 11-16, 2018.
Sridharan, V., et al., "Memory Errors in Modern Systems: The Good, The Bad, and the Ugly," In Proceedings of the International Symposium on Architectural Support for Programming Languages and Operating Systems (ASPLOS), pp. 297-310, Mar. 14, 2015.
Tiwari, D., et al., "Understanding GPU Errors on Large-Scale HPC Systems and the Implications for System Design and Operation," In Proceedings of the International Symposium on High Performance Computer Architecture (HPCA), pp. 331-342, Feb. 7-11, 2015.
Zimmerman, R., "Efficient VLSI Implementation of Modulo Addition and Multiplication," In Proceedings of the IEEE Symposium on Computer Arithmetic, pp. 158-167, Apr. 14-16, 1999.
Zulkifli, S.M., et al., "High-Res 3D X-Ray Microscopy for Non-Destructive Failure Analysis of Chip-to-Chip Micro-Bump Interconnects in Stacked Die Packages," In Proceedings of the International Symposium on Physical and Failure Analysis of Integrated Circuits (IPFA), Jul. 4-7, 2017, pp. 1-5.
Dell, T.J., "A White Paper on the Benefits of Chipkill-Correct ECC for PC Server Main Memory," IBM Microelectronics Division, Nov. 19, 1997, pp. 1-23.

\* cited by examiner

SINGLE-CYCLE BYTE CORRECTING AND MULTI-BYTE DETECTING ERROR CODE

CLAIM OF PRIORITY

This application claims the benefit of U.S. Provisional Application No. 63/246,542 titled "SSC-DSD+: AN IMPROVED SINGLE-CYCLE BYTE CORRECTING AND MULTI-BYTE DETECTING ERROR CODE," filed Sep. 21, 2021, the entire contents of which is incorporated herein by reference.

TECHNICAL FIELD

The present disclosure relates to error checking and correcting schemes. More specifically, the embodiments set forth below describe a single-cycle byte correcting and multi-byte detecting error code.

BACKGROUND

Business-critical servers, data centers, autonomous vehicles, and high-performance computing systems typically rely on commodity hardware with error checking and correcting (ECC) codes applied to large memory structures to increase hardware reliability. Parallel processing unit (PPU) acceleration in these systems is critical for high performance and energy efficiency, making PPU resilience a priority. Modern compute-class PPUs and accelerators employ wide on-package second-generation high-bandwidth memory (HBM2) to sustain high main memory throughput.

Main memory is the largest and most vulnerable storage structure in most systems, making effective dynamic random-access memory (DRAM) ECC central to any comprehensive error detection and correcting scheme. Memory dual in-line memory modules (DIMMs) in most central processing unit (CPU) nodes are composed of narrow four bit (4 b) wide DRAM devices, meaning that soft errors in these memories are typically confined to the four bytes (4 B) of data coming from a single DRAM chip. Tailored "chipkill" CPU ECC codes are able to detect and correct the data coming from an entirely-faulty 4 b DRAM device using the 12.5% of available ECC redundancy, offering high soft error protection while remaining oblivious to underlying error patterns. In contrast, PPU memory is much wider (e.g., 64 b wide per HBM2 pseudo-channel), and each memory entry is fetched from a single DRAM device, making a whole-device protection impossible without a prohibitively large memory access granularity or additional redundancy. Understanding the underlying data corruption patterns is therefore crucial for HBM2 memory, as an effective ECC code must be tailored to detect or correct the most prevalent multi-bit errors. PPUs reportedly employ single-bit-error-correcting and double-bit-error-detecting (SEC-DED) ECC for DRAM, which is found to be suboptimal for HBM2.

As memory capacities scale, effective correction of one byte error and detection of multi-byte errors will become more and more critical to ensure the availability (high correction) and safety (high detection) of future PPU-based memory systems. Such protection is especially important for future high-memory-capacity products. Therefore, there is a need for improving ECC schemes so as to ensure the good performance of the memory products.

SUMMARY

Error checking and correcting schemes are disclosed herein to provide byte correction with fewer uncorrectable transient/permanent errors and many orders of magnitude reduced silent data corruption (SDC) risk relative to the safest alternative error correcting codes.

In accordance with a first aspect of the present disclosure, a memory device is provided that implements an error checking and correction scheme. The memory device includes logic to: calculate four syndrome symbols in accordance with a Reed-Solomon (RS) codeword; determine three location bytes in accordance with three corresponding pairs of syndrome symbols in the four syndrome symbols; and generate an output based on a comparison of the three location bytes. The output may include: corrected data responsive to determining that the three location bytes match; an indication of a detected-and-corrected error (DCE) responsive to determining that two of the three location bytes match; or an indication of a detected-yet-uncorrected error (DUE) responsive to determining that none of the three location bytes match.

In accordance with an embodiment of the first aspect, the logic includes: four discrete logarithm logic circuits, each discrete logarithm logic circuit configured to process a corresponding syndrome symbol; and three end-around-carry (EAC) subtractors, each EAC subtractor configured to process a corresponding pair of result bytes from two of the four discrete logarithm logic circuits.

In accordance with an embodiment of the first aspect, the RS codeword is 36 bytes and includes information for a 32 byte data word.

In accordance with an embodiment of the first aspect, the RS codeword is 68 bytes and includes information for a 64 byte data word.

In accordance with an embodiment of the first aspect, the output includes the indication of the DCE and corrected data that has been corrected based on error locations indicated by the two matching location bytes.

In accordance with an embodiment of the first aspect, the comparison of the three location bytes is performed by a carry-free modular difference equality tester (CFMDET) circuit.

In accordance with an embodiment of the first aspect, the memory device is a dynamic random access memory (DRAM) device.

In accordance with an embodiment of the first aspect, the memory device is coupled to a parallel processing unit.

In accordance with an embodiment of the first aspect, the logic is integrated in control logic included in a DRAM module or in peripheral circuits of a memory array in the DRAM module.

In accordance with a first aspect of the present disclosure, a system is provided that includes: at least one processor; and a memory device connected to the processor and configured to store data using a single symbol correction, double symbol detection (SSC-DSD+) error correction code (ECC) encoding scheme. The memory device includes logic to: calculate four syndrome symbols in accordance with a Reed-Solomon (RS) codeword; determine three location bytes in accordance with three corresponding pairs of syndrome symbols in the four syndrome symbols; and generate an output based on a comparison of the three location bytes. The output may include: corrected data responsive to determining that the three location bytes match; an indication of a detected-and-corrected error (DCE) responsive to determining that two of the three location bytes match; or an indication of a detected-yet-uncorrected error (DUE) responsive to determining that none of the three location bytes match.

In accordance with an embodiment of the second aspect, the logic includes: four discrete logarithm logic circuits, each discrete logarithm logic circuit configured to process a corresponding syndrome symbol; and three end-around-carry (EAC) subtractors, each EAC subtractor configured to process a corresponding pair of result bytes from two of the four discrete logarithm logic circuits.

In accordance with an embodiment of the second aspect, the RS codeword is 36 bytes and includes information for a 32 byte data word.

In accordance with an embodiment of the second aspect, the RS codeword is 68 bytes and includes information for a 64 byte data word.

In accordance with an embodiment of the second aspect, the output includes the indication of the DCE and corrected data that has been corrected based on error locations indicated by the two matching location bytes.

In accordance with an embodiment of the second aspect, the comparison of the three location bytes is performed by a carry-free modular difference equality tester (CFMDET) circuit.

In accordance with an embodiment of the second aspect, the memory device is a dynamic random access memory (DRAM) device.

In accordance with an embodiment of the second aspect, the memory device is coupled to a parallel processing unit.

In accordance with an embodiment of the second aspect, the logic is integrated in control logic included in a DRAM module or in peripheral circuits of a memory array in the DRAM module.

In accordance with an embodiment of the second aspect, the memory device is connected to a memory interface.

In accordance with an embodiment of the second aspect, the memory interface comprises a double data rate 4 (DDR4) or double data rate 5 (DDR5) synchronous dynamic random access (SDRAM) memory interface.

BRIEF DESCRIPTION OF THE DRAWINGS

The present systems and methods for error checking and correcting are described in detail below with reference to the attached drawing figures, wherein.

DETAILED DESCRIPTION

Figure 1:
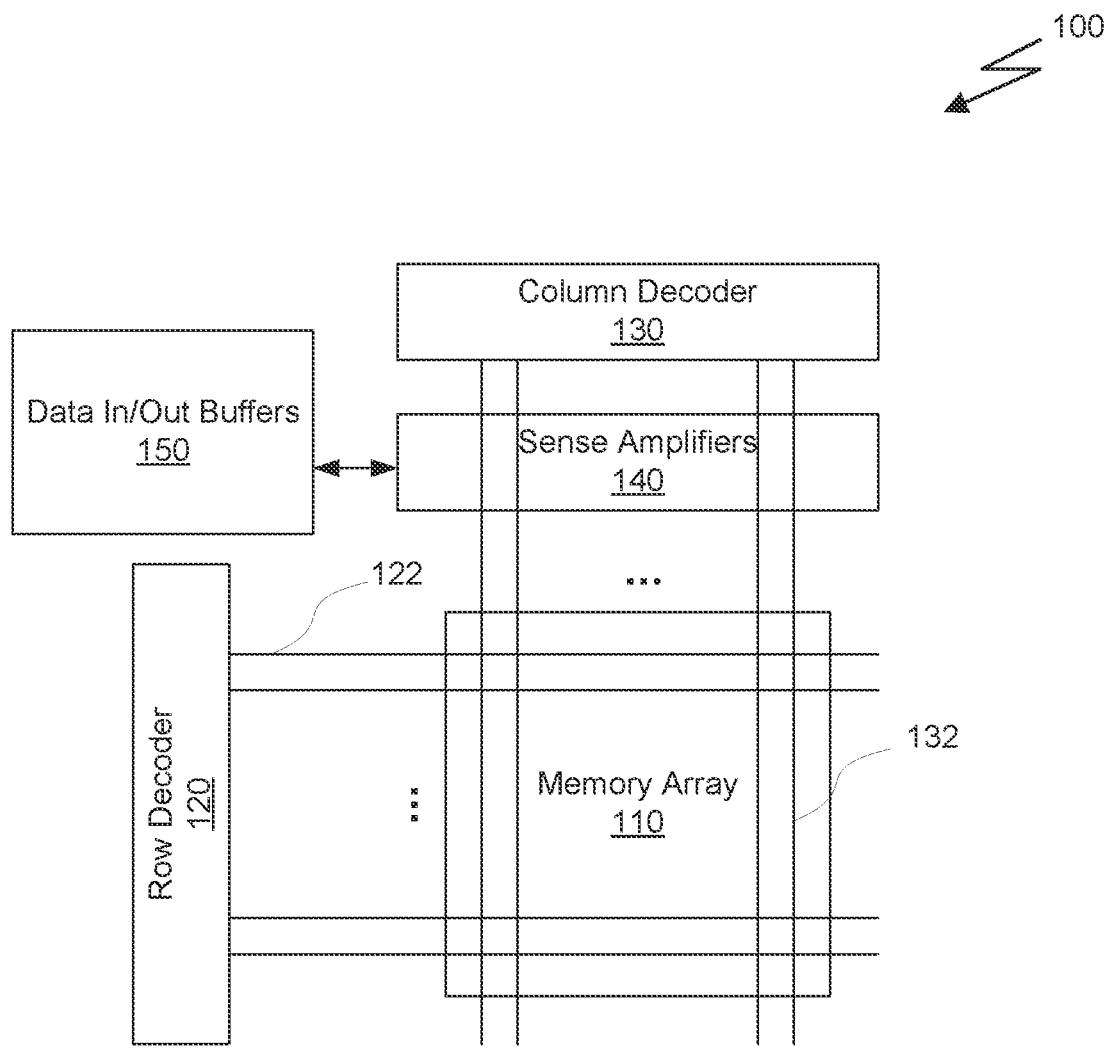
FIG. 1 demonstrates a memory array and peripheral circuits in a DRAM, in accordance with some embodiments.

Devices and methods are disclosed related to error checking and correcting (ECC) schemes. In an embodiment, a decoder is disclosed to implement a single-cycle-decodable symbol-based ECC scheme referred to herein as SSC-DSD+, where "SSC" stands for single-symbol-correcting, and "DSD" stands for double-symbol-detecting. The SSC-DSD+ utilizes 4 redundant bytes (12.5% redundancy @ 32B data size) for single-byte correction, double-byte detection, and almost triple-byte detection, with 99.999964% of triple-byte errors detected. Apart from byte errors, the SSC-DSD+ has complete triple-bit error detection, pin error detection, and 99.999756% coverage against whole-entry random corruption. The SSC-DSD+ decoder is built upon a one-shot Reed-Solomon (RS) decoder, which provides a single-cycle "one-shot" solution to a special case of single-byte error correction. The SSC-DSD+ decoder implements the following key processes: (1) four syndrome bytes are generated; (2) one-shot error location is performed using each pair of syndromes; and (3) if the calculated error locations disagree, a detectable-uncorrectable error is reported. This heuristic approach detects all double-symbol and the vast majority of triple-symbol errors without fully solving the error locator polynomial, which normally consumes at least 8 cycles based on iterative algebraic decoding procedures, thus enabling an efficient, single-cycle decoder.

The SSC-DSD+ scheme requires 32 bits of redundancy, unlike prior ECC schemes for non-HBM memories that operate using 16 bits of ECC. The SSC-DSD+ protection can either be achieved through doubling the amount of redundancy for non-HBM memories (to 12.5% redundancy, same as HBM2) or by doubling the information size encoded in the codeword to 64 B (6.25% redundancy, same as current non-HBM ECC). Because the ARM cache line size is 64 B, such a doubled information size may have little impact on the performance of CPU-attached large-capacity low-power double data rate (LPDDR) memory.

SSC-DSD+ features a fast and efficient single-cycle decoder. Implemented in TSMC 16-nanometer technology, the SSC-DSD+ decoder takes as little as 0.39 nanoseconds to execute, and at worst consumes 2,223 $\mu m^2$ of logic area—roughly ⅔ as much area as a 64-bit floating-point multiplier in a commonly used library. When implementing the SSC-DSD+ decoder, only one decoder is needed per DRAM channel or pseudo-channel. The delay/area of the SSC-DSD+ decoder are roughly two to three times that of the current non-HBM single-bit-error-correct and double-bit-error-detect (SEC-DED) ECC, yet SSC-DSD+ provides vastly superior correction and error detection capabilities.

In an embodiment, a variant of the SSC-DSD+ decoder is disclosed to achieve an increased decoding speed. The modified SSC-DSD+ decoder is referred to as a speed-of-light (SOL) SSC-DSD+ decoder, which takes sanity checking off the critical path so as to reduce the overall delay in the SOL decoder.

The following describes certain types of DRAM memories and the soft error patterns presented therein, in accordance with some embodiments. Based on the understanding of the soft error patterns, the ECC schemes in the present disclosure are tailored to detect or correct the most prevalent multi-bit errors, such that these ECC schemes can be effective when implemented to perform ECC in those types of DRAM memories.

Modern DRAM is complex and deeply hierarchical, with components that can fail at multiple granularities and affect a varying number of bits per memory entry. For example, each HBM2 stack is composed of eight 512 MB channels, each with separate data, control, and power pins. Each HBM2 channel is split into 16 banks that share the channel pins. DRAM is accessed by a split row and column address. A row activation command brings 2 KB of data from the DRAM bit-cells into a bank-local row buffer. Following read and write commands access one 32 B column of the row buffer at a time. There is not a single row buffer per bank, but rather each bank is composed of 32 subarrays, each with its own row buffer. A 32 B DRAM read draws all of its data from a single subarray, and only one subarray is selected at a time. Each subarray is further split into 32 data mats, each of which fills an 8 b wide slice of the 2 KB row buffer. The DRAM bit-cells reside within these data mats, and each mat is composed of a 512×512 array of bits. Rows of the mat are activated by local word lines and each bit of an activated row is transmitted to the 512 b mat-local row buffer slice through a bitline. Each DRAM read selects an 8 b column from each mat through a local column multiplexer (MUX).

FIG. 1 demonstrates a memory array 110 and peripheral circuits in a DRAM 100, in accordance with some embodiments. The memory array 110 may be a mat among an array of mats in the DRAM 100. Alternatively, the memory array 110 may include a plurality of mats in a grid layout. The memory array 110 stores data/codes. The peripheral circuits are used for accessing the storage space in the memory array 110. The peripheral circuits may include a row decoder 120, a column decoder 130, sense amplifiers 140 and data in/out buffers 150.

A memory array 110 may include a plurality of bit-cells arranged in a matrix form. Each bit-cell may include circuit elements, such as transistors, capacitors, etc., to maintain a logic level (e.g., "0" or "1"), so as to store a bit of information. Rows of the memory array 110 may be connected to the row decoder 120 via a plurality of row buses 122. The row buses 122 are also referred to as wordlines. The row decoder 120 may be configured to activate one or more rows in the memory array 110 by sending an activation signal to one or more row buses 122. Columns of the memory array 110 may be connected to the column decoder 130 via a plurality of column buses 132. The column buses 132 are also referred to as bitlines. The column decoder 130 may be configured to activate one or more columns in the memory array 110 by sending an activation signal to one or more column buses 132. In programming, a byte (B) is the smallest unit of memory used in computing. Bytes consist of eight bits, and a byte is used to encode a single number, letter, or symbol. A memory access granularity is the number of bytes to be accessed at a time. A memory access boundary is where the number of bytes begins.

The sense amplifiers 140 are part of read circuitry that is used when data is read from the memory array 110. A sense amplifier 140 may include circuit elements, such as power amplifiers, to facilitate the function of sensing the low power signals from a bit line and amplifying the small signals (e.g., small voltage swing) so as to recognize logic levels stored in the corresponding bit-cells. The data in/out buffers 150 may temporarily store data read from the memory array 110 or to be written into the memory array 110.

Modern compute-class GPUs rely on high-bandwidth on-package HBM2 memory to support many concurrent DRAM accesses. The minimum access granularity of HBM2 memory is 32 B. To illustrate in embodiments of the present disclosure, GPUs support a fine-grained 32 B accesses granularity. Each 32 B block in HBM2 is referred to as a memory entry, such that each read fetches a single entry.

DRAM is the GPU component with the largest raw soft error rate, and the DRAM ECC schemes in the present disclosure target for correcting the majority and detecting nearly all of these errors. As DRAM scales to smaller feature sizes, the relative rate of severe multi-bit errors is increasing, necessitating more tailored ECC design. Evidence indicates these severe errors originate in DRAM logic, which exhibit patterns due to the DRAM microarchitecture.

Soft errors are non-destructive events that corrupt memory until a following write. Such errors are concerning, as they pose a significant risk of silent data corruption (SDC). A term "breadth" is used to indicate the number of 32 B memory entries that can be affected by a single fault. A term "severity" is used to indicate the number of bits per entry that can be affected. Energetic neutrons produced by cosmic rays are the dominant soft error cause in the terrestrial environment. Neutron beam testing offers a way to perform accelerated testing to judge the terrestrial soft error rate and error patterns.

Figure 2:
FIG. 2 presents a bar chart demonstrating DRAM error patterns for both transient and permanent DRAM errors, in accordance with some embodiments.

FIG. 2 is a bar chart 200 demonstrating DRAM error patterns for both transient and permanent DRAM errors. The transient DRAM errors are measured from HBM2 memories. The permanent DRAM errors are measured from LPDDR5 memories, where LPDDR stands for low-power double data rate and is a type of non-HBM memory.

As shown in FIG. 2, the vertical axis 210 in the bar chart 200 indicates a percentage of error events in a class among all error events. Along the horizontal axis 220, the error events are categorized into four classes, 222, 224, 226, and 228. From left to right, the four classes are arranged in an order with increasing severity. Class 222 refers to the type of single-bit error. A single-bit error occurs when only one bit of a given data unit is changed from 1 to 0 or from 0 to 1. Class 224 refers to the type of double-bit error. A double bit error occurs when a received code differs from one of the codes in the table by two bits, that is a Hamming distance of two. Class 226 refers to the type of error with multiple bits (≥3 b) of errors in a single byte. Class 228 refers to the type of error with multiple bits (≥3 b) of errors in multiple bytes. The legend 230 includes two bars with different patterns representing transient and permanent DRAM errors, respectively.

The distribution of errors as demonstrated in FIG. 2 indicates that most multi-bit errors affect a single logically-contiguous byte. These errors in class 226 are likely corresponding to the 8 b-wide DRAM mats where data resides. FIG. 2 also indicates that very severe errors that affect multiple bits of a DRAM transfer are more common than arbitrary 2-bit errors. The error pattern distribution also indicates single-byte errors are more prevalent than multi-byte errors.

With the understanding of the error patterns in certain types of DRAMs as demonstrated in FIG. 2, the present disclosure provides tailored DRAM ECC schemes to address these errors in the DRAMs.

An error checking and correcting (ECC) code detects and possibly corrects errors using redundant values that are algorithmically generated from the protected data. For instance, an (N, K) code has N total number of symbols with K number of information symbols and R=(N−K) number of check-symbols. The worst-case error detecting and correcting capabilities of an ECC code are often characterized by the maximum number of bytes or bits that the ECC code can detect and correct. An error that is within the theoretical correction capabilities of an ECC code will result in a detected-and-corrected error (DCE). An error that is within the detection capability will be a detected-yet-uncorrected error (DUE). An error that exceeds the theoretical coverage of a code can either be detected (resulting in a DUE) or lead to silent data corruption (SDC).

HBM2 memory devotes 12.5% redundancy for ECC check-bits, and compute-class GPUs reportedly apply a single-bit-error-correcting and double-bit-error-detecting (SEC-DED) code to DRAM. These codes are fast and efficient, but they work best for isolated direct-cell strikes and logic errors can exceed their maximum detection and correction capabilities.

In an embodiment, an SSC-DSD+ scheme is provided, allowing single-byte correction, double-byte detection, triple-byte detection, pin detection, almost triple-byte detection, and very good coverage against more severe corruption.

To illustrate, a decoding problem of a RS code is described as follows. An RS (N, K) code has N total number of symbols with K number of information symbols and R=(N−K) number of check-symbols. A transmitted message is encoded with RS codes to form a transmitted polynomial, referred to as a transmitted codeword c(x), where $c(x)=\Sigma_{i=0}^{n-1} c_i x^i$ and n=N. RS codes are defined over a finite field, also known as a Galois field $GF(2^m)$. The integer in is the number of bits per symbol. The Galois field $GF(2^m)$ has $2^m$ number of primitive elements, where a is a primitive element of $GF(2^m)$. A RS codeword is generated using a special polynomial, referred to as a generator polynomial g(x). All valid codewords are exactly divisible by the generator polynomial. Therefore, if the received codeword is the same as c(x), the polynomial division of the received codeword by the generator polynomial has no remainder. However, the transmitted polynomial c(x) may be corrupted in transit causing a received polynomial r(x) incorporated with an error polynomial e(x), that is $r(x)=c(x)+e(x)=\Sigma_{i=0}^{n-1} r_i x^i$. Then, the polynomial division of the received codeword r(x) by the generator polynomial g(x) results in the error polynomial e (x) as the reminder. The error polynomial may be obtained by computing syndromes:

$$S_{j-1}=r(a^j)=e(a^j)=e_0+e_1 a^j+e_2 a^{2j}+ \ldots e_{n-1}a^{(n-1)j}, j=1, 2, \ldots, 2t \quad \text{(Eq. 1)}$$

where $e_i \in \{0,1\}$, 2t equals R=(N−K), and a is a primitive element of $GF(2^m)$. Assume that errors occur at locations $i_1, i_2, \ldots, i_v$, where v≤t. Then, $e_{i_l}=1$, when l=1, 2, …, v. Otherwise, $e_{i_l}=0$. Therefore, Equation 1 can be written as:

$$S_{j-1}=e(a^j)=a^{ji_1}+a^{ji_2}+\ldots a^{ji_v}, j=1,2,\ldots,2v, \quad \text{(Eq. 2)}$$

where $i_1, i_2, \ldots, i_v$ are defined as error locators. An error locator polynomial may be defined as:

$$\Lambda(x)=(1-a^{i_1}x)(1-a^{i_2}x) \ldots (1-a^{i_v}x)=1+\Lambda_1 x^1+ \ldots +\Lambda_v x^v=\Sigma_{i=0}^v \Lambda_i x^i, \quad \text{(Eq. 3)}$$

where $$\Lambda\left(\frac{1}{a^{i_l}}\right) = 0, l = 1, 2, \ldots, v.$$

$E_{i_l}$ may be defined as an actual error value at the corresponding error location. Suppose v=1, that is a single-byte error. Then, $S_0=a^{i_1}$, and $\Lambda(x)=(1-a^{i_1}x)=1-S_0 x$.

The error(s) in the error polynomial e(x) may be estimated by various techniques. For instance, the error-location polynomial and actual error values may be solved by utilizing a Toeplitz matrix and a Vandermonde matrix, as well as algorithms such as the Berlekamp-Massey, Euclid, and Forney algorithms. A RS decoder can correct up to t symbols that contain errors in a codeword, that is v≤t, where 2t=r=n−k.

In an embodiment, the SSC-DSD+ utilizes a modified single-shot RS decoder. One example of a single-shot RS decoder is disclosed by Katayama et al. in "One-Shot Reed-Solomon Decoding for High-Performance Dependable Systems," published in the International Conference on Dependable Systems and Networks (DSN), 2000, pp. 390-399, the entire contents of which is incorporated herein by reference. Katayama et al. describes a single-shot RS scheme, which solves equations of calculating error-locator polynomials and error polynomials in a symbol-parallel manner. Katayama incorporates a "new error evaluation" algorithm, which uses only one polynomial Er(x), for symbol-parallel, direct linear error evaluation. In a special case of single-byte error correction, the single-shot RS scheme provides the following exemplary calculation results for t=1, $$\Lambda_4^{(1)}=\Lambda_3^{(1)}=\Lambda_2^{(1)}=0 \quad \text{(Eq. 4)}$$

$$\Lambda_1^{(1)}=S_1, \quad \text{(Eq. 5)}$$

$$\Lambda_0^{(1)}=S_0, \quad \text{(Eq. 6)}$$

$$Er_{3*}^{(1)}=Er_{2*}^{(1)}=Er_{1*}^{(1)}=0, \quad \text{(Eq. 7)}$$

$$Er_0^{(1)}=S_0, \quad \text{(Eq. 8)}$$

where (1) indicates a single-byte error. By applying Equations 4-8, a single-shot RS decoder can achieve a fast, single-cycle (i.e., "one-shot") to calculate the error polynomial using a pair of syndromes so as to perform single-byte error correction.

Figure 3A:
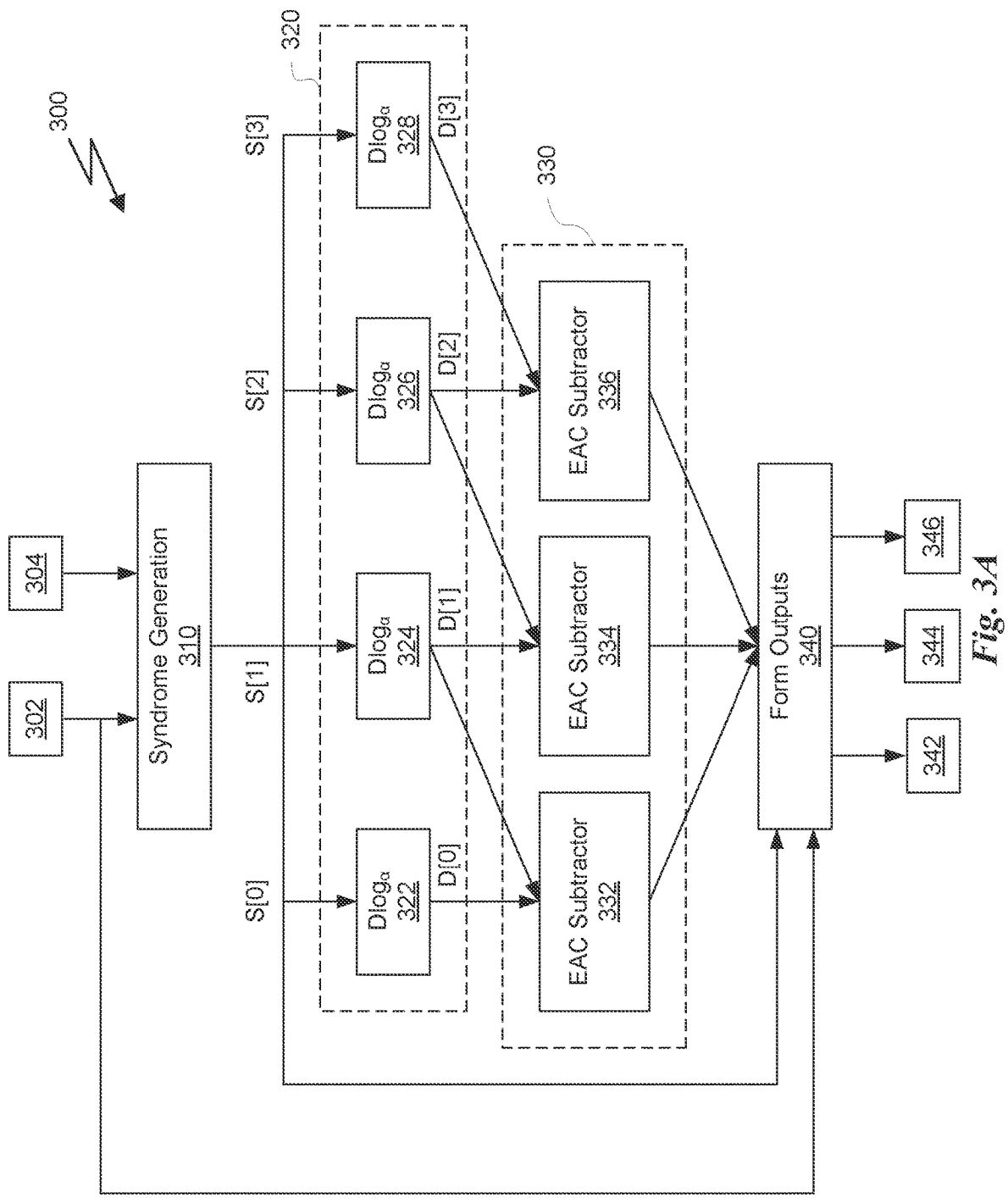
FIG. 3A illustrates an exemplary decoder for an SSC-DSD+ error correction code (ECC) scheme, in accordance with some embodiments.

FIG. 3A demonstrates an exemplary hardware implementation 300 for facilitating the SSC-DSD+ scheme, in accordance with some embodiments. The hardware implementation 300 may be integrated in control logic included in a DRAM module, peripheral circuits of a memory array as show in FIG. 1, and/or other components in a memory device.

The hardware implementation 300 takes data 302 and check-bytes 304 as inputs and uses various logic components included in syndrome generation 310, logarithm logic 320, subtraction logic 330, and output formation 340 to detect and/or correct error(s).

To illustrate in this example, the syndrome generation 310 in the hardware implementation 300 may receive a 36 B codeword in an instance. In another instance, the codeword may be 68 B in length. The 36 B codeword may be obtained by encoding 32 B data using four check symbols. In this example, a symbol includes eight bits, and is also referred to as a check byte. The RS codes used to encode/decode the codeword may be determined by using an irreducible polynomial α as the generator polynomial. In this example, a primitive polynomial is adopted, expressed by $$\alpha=x^8+x^6+x^5+x+1. \quad \text{(Eq. 9)}$$

The syndrome generation 310 may include parallel Galois field multipliers ($GF(2^m)$ multipliers) to determine valid codewords, which are the RS codes. Since a symbol includes eight bits, parallel $GF(2^8)$ multipliers are used. The syndrome generation 310 calculates syndromes based on the received codeword and the check bytes by applying Equation 2. As a result, the syndrome generation 310 generates four syndromes, S[0], S[1], S[2], and S[3]. Each generated syndrome is associated with one of the four check bytes. The syndrome generation 310 passes these syndromes to four branches in the logarithm logic 320.

The logarithm logic 320 includes four branches, 322, 324, 326, and 328, which take the four syndromes S[0], S[1], S[2], and S[3] as inputs. Each branch in the logarithm logic 320 includes a discrete logarithm logic (D Log$_\alpha$) unit to process a corresponding syndrome so as to generate polynomial logarithm value for the given syndrome. The D Log$_\alpha$ unit, in one embodiment, may generate a logarithm value for the syndrome using a look-up table. As a result, the logarithm logic 320 generates four logarithm values that can be combined to form three pairs of logarithm values (e.g., D[0], D[1], D[2], and D[3]) corresponding to pairs of the four syndromes.

The subtraction logic 330 includes three end-around-carry (EAC) subtractors 332, 334, and 336 to process the three pairs of logarithm values. Each end-around-carry (EAC) subtractor generates a location byte indicating single-symbol error location. As such, the EAC subtractor 332 takes one pair of logarithm values D[0] and D[1], and generates a first location byte. The subtractor 334 takes one pair of logarithm values D[1] and D[2], and generates a second location byte. The subtractor 336 takes one pair of logarithm values D[2] and D[3], and generates a third location byte.

A mathematical description of the modified one-shot RS decoder implemented by the hardware implementation 300 is as follows. First, the received vector Y is defined as the sum of the initial vector X and an error vector E, as shown below:

$$Y = X + E \quad \text{(Eq. 10)}$$

Multiplying the received vector Y by the parity check matrix H gives the following:

$$Q = H + Y^T + H \times (X + E)^T = \begin{bmatrix} 0 \\ 0 \end{bmatrix} + H \times E^T = H \times E^T \quad \text{(Eq. 11)}$$

When a single symbol in the received vector Y has an error, then the E vector has a single non-zero element in position i. The Q vector can then be reduced to:

$$Q = \begin{bmatrix} q_0 \\ q_1 \end{bmatrix} = \begin{bmatrix} e_i \\ e_i H[1, i] \end{bmatrix}, \quad \text{(Eq. 12)}$$

which leads to:

$$e_i = q_0 \quad \text{(Eq. 13)}$$

$$q_1 = e_i H[1, i] = q_0 H[1, i] \quad \text{(Eq. 14)}$$

$$H[1, i] = \frac{q_1}{q_0} \quad \text{(Eq. 15)}$$

The correction of the received vector Y is essentially performed by doing a division operation, looking up the result in a table to determine a symbol position of the error, and then adding $q_0$ to that element of the received vector Y to get the corrected vector X.

However, a shortcut that eliminates the need for the division operation can be achieved using a unique encoding matrix H as follows:

$$H = \begin{bmatrix} 1 & 1 & 1 & 1 & 1 & 1 & 1 & 1 & & 1 & 0 \\ \gamma^1 & \gamma^2 & \gamma^3 & \gamma^4 & \gamma^5 & \gamma^6 & \gamma^7 & \ldots & & 0 & 1 \end{bmatrix} \quad \text{(Eq. 16)}$$

Plugging this back into the Equations above leads to:

$$H[1, i] = \gamma^{i+1} = \frac{q_1}{q_0} \quad \text{(Eq. 17)}$$

$$\log_\gamma(\gamma^{i+1}) = \log_\gamma(q_1) - \log_\gamma(q_0) \quad \text{(Eq. 18)}$$

$$i = [\log_\gamma(q_1) - \log_\gamma(q_0)] - 1 \quad \text{(Eq. 19)}$$

Because $q_i$ are essentially the syndromes generated by the syndrome generation 310, it becomes clear that the identifying the symbol location i for each pair of syndromes can be reduced to two logarithm operations and a subtraction operation, which are implemented by the logarithm logic 320 and the subtraction logic 330. The three different branches produce three separate location bytes (e.g., 8-bit values for symbol location i) based on the three corresponding pairs of syndromes.

The output formation 340 may form different outputs based on the location bytes output from the subtraction logic 330. If all three error locations in the first, second, and third location byte agree, the output formation 340 performs correction on the received data, which forms an output 342. The output formation 340 may use the syndromes generated by the syndrome generation 310 and the location bytes generated by the subtraction logic 330 to further determine the corrected data values. For instance, the first syndrome of the pair may be utilized as the error value added to the byte identified by the location byte.

When the output formation 340 determine that at least two of the location bytes disagree with an error location, the output formation 340 may or may not be allowed to correct the errors in the 32 B data depending on the following two cases. The output formation 340 may generate an indication of DCE (a detected-and-corrected error) in the output 344, if two of the error locations agree (e.g., two of the three location bytes are equal). The 32 B data may be corrected in this case using the syndrome corresponding to at least one of the two location bytes that agree. The indication may include the location byte for the two error locations that agree. The output formation 340 generates an indication of DUE (a detected-yet-uncorrected error) in the output 346, if all three error locations are different. The 32 B data is not corrected in this case. As such, the implementation 300 provides for complete double-symbol error detection and nearly-triple-symbol error detection in a heuristic manner.

In this example, 4 B check bytes are used to encode 32 B information data, thus requiring 12.5% of redundancy. The SSC-DSD+ protection can be achieved through doubling the amount of redundancy for non-HBM memories to 12.5% redundancy, same as HBM2. The 12.5% of available HBM2 redundancy can be used to create a single (36, 32) codeword. Alternatively, the SSC-DSD+ protection can be achieved by doubling the information size to 64 B to create a (68, 64) codeword (6.25% redundancy, same as current non-HBM ECC). Because the ARM cache line size is 64 B, such a doubled data size may have little impact on the performance of CPU-attached large-capacity LPDDR memory.

Figure 4:
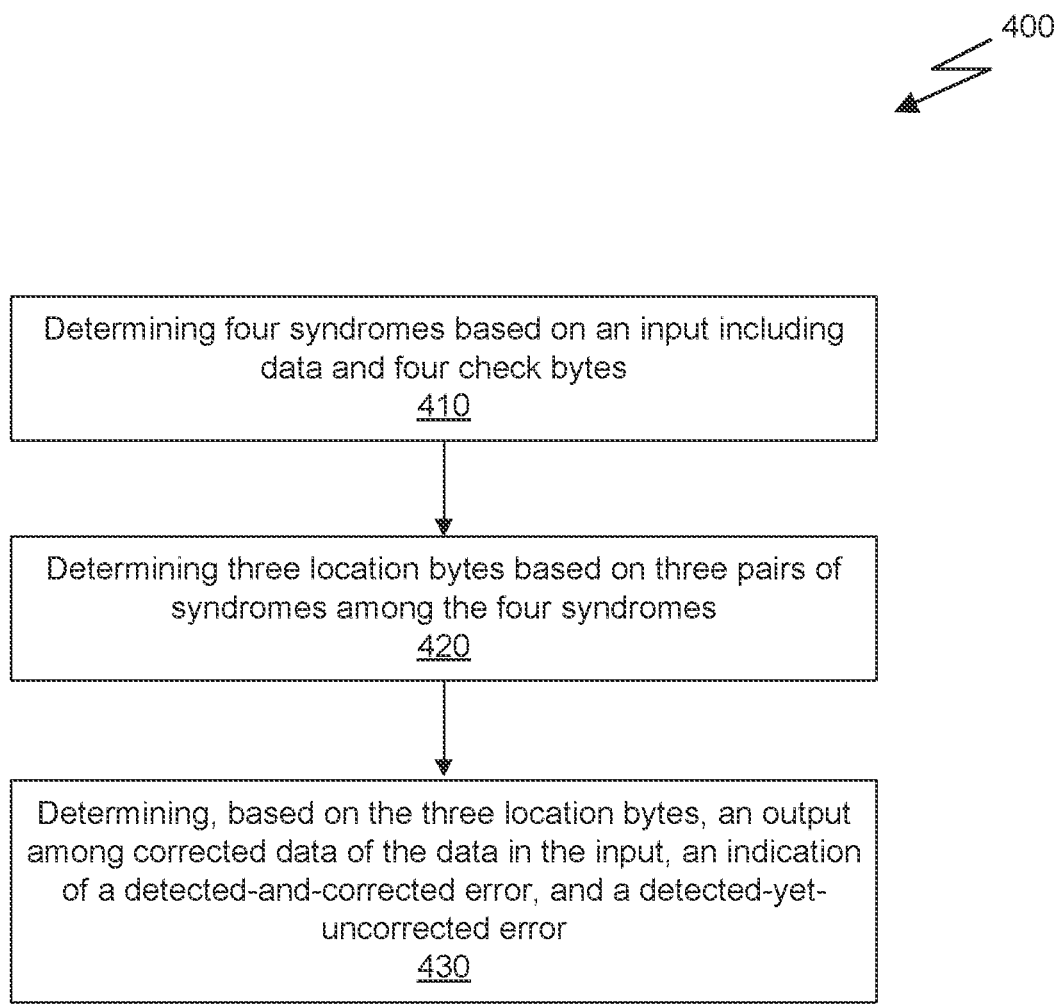
FIG. 4 illustrates a flowchart of a method of an algorithm for implementing the SSC-DSD+ scheme, in accordance with some embodiments.

FIG. 4 illustrates a process 400 of implementing the SSC-DSD+ schemes, in accordance with some embodiments. A memory device having the hardware implementation 300 as shown in FIG. 3A implemented therein may be used to execute the process 400.

At block 410, the memory device may generate four syndromes based on an input. Block 410 may be facilitated by the syndrome generation 310 in the hardware implementation 300 as shown in FIG. 3A. The input may include 32 B data 302 and four check-bytes 304. In an embodiment, the input may be a 36 B codeword (CW) including 32 B of data and 4 B of check-bits based on Reed-Solomon (RS) codes. In a further embodiment, the Reed-Solomon codes may be generated by a generator polynomial, for example, the one expressed by Equation 9. The memory device may further implement parallel $GF(2^m)$ multipliers to generate the RS codes, where m is the number of bits included in a symbol.

At block 420, the memory device may determine three location bytes based on three pairs of syndromes among the four syndromes. Block 420 may be facilitated by the logarithm logic 320 and the subtraction logic 330 in the hardware implementation 300 as shown in FIG. 3A. The memory device may determine the location bytes based on corresponding pairs of syndromes.

At block 430, the memory device may determine an output. The output may include data (either corrected or uncorrected), an indication of a detected-and-corrected error, and/or an indication of a detected-yet-uncorrected error, based on the three location bytes obtained in block 420. Block 430 may be facilitated by the output formation 340 in the hardware implementation 300 as shown in FIG. 3A. The output may include corrected data if all three error locations in the location bytes generated in block 420 agree (e.g., match). The output may include an indication of DCE (a detected-and-corrected error), if two of the error locations agree. The indication may include the error locations from the two location bytes that agree. The output may include an indication of DUE (a detected-yet-uncorrected error), if all three location bytes are different. Thus, the comparison of the location bytes provides a sanity check that ensures an accuracy of the correction assuming the number of errors is located in a single byte.

Figure 3B:
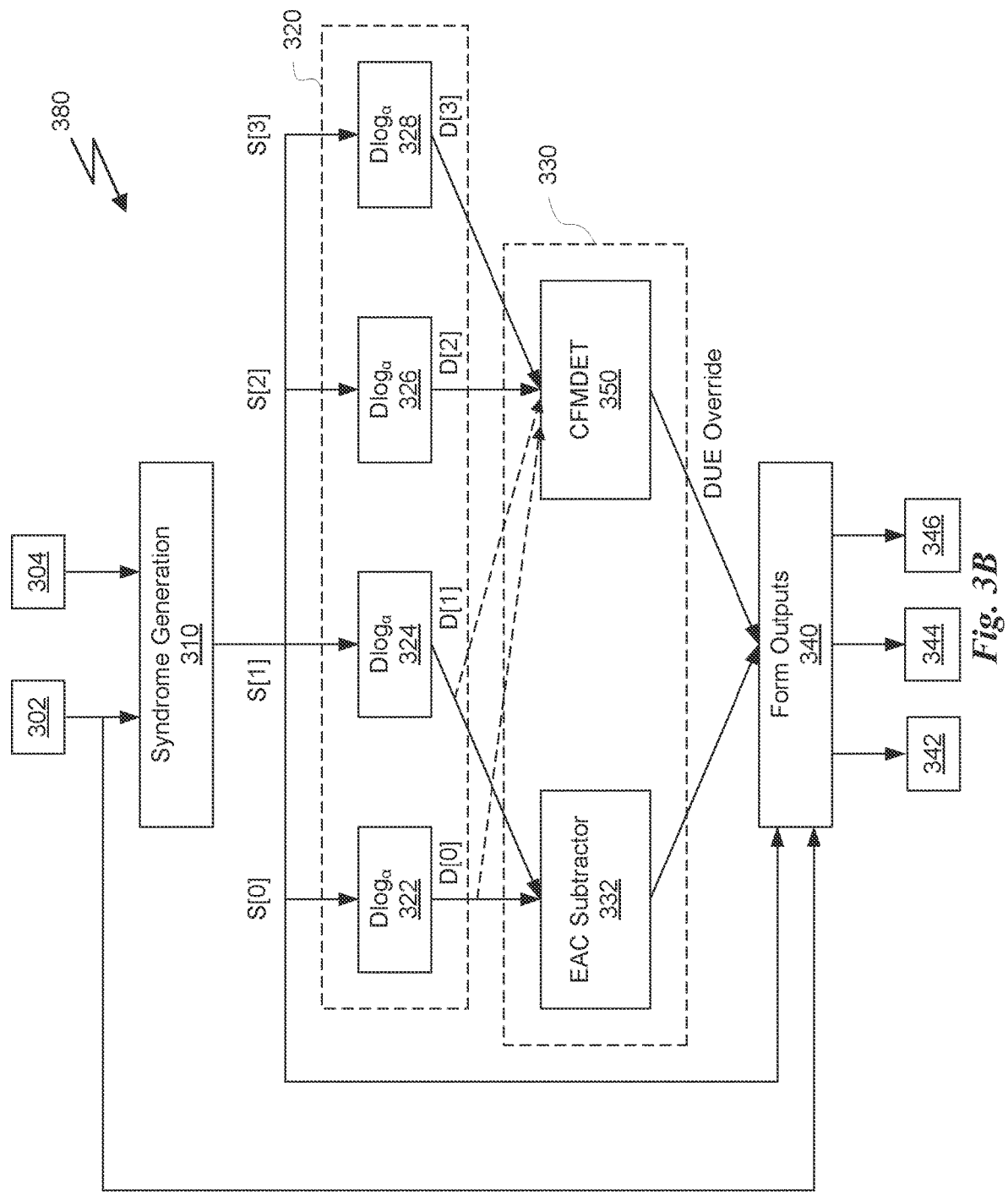
FIG. 3B illustrates a variant of the decoder for the SSC-DSD+ ECC scheme, in accordance with some embodiments.

FIG. 3B illustrates a variant of the SSC-DSD+ decoder, in accordance with another embodiment. The variant of the SSC-DSD+ decoder is disclosed to achieve an increased decoding speed. Because the delay of the decoder is limited by the critical path in the circuit, which is defined as the path between an input and an output with the maximum delay, the variant decoder is modified by taking sanity checking off the critical path (e.g., removing the sanity check from the output formation 340) and adding only a single AND gate of delay to the SSC-DSD+ decoder decoder.

As shown in FIG. 3B, the EAC subtractors 334 and 336 are replaced with a carry-free modular difference equality tester (CFMDET) 350. The CFMDET 350 accepts all four logarithm values D[0]-D[3] and provides a single Boolean sanity check value (e.g., DUE Override) to the output formation 340. Specifically, the CFMDET 350 compares the difference between D[1] and D[0] to the difference between D[2] and D[1] (e.g., D[1]-D[0]==D[2]-D[1]) and compares the difference between D[2] and D[1] to the difference between D[3] and D[2] (e.g., D[2]-D[1]==D[3]-D[2]). The result of these two comparisons is used to set the DUE Override bit. The CFMDET 350 may perform the sanity check in parallel with the EAC subtractor 332 calculating a single location byte based on D[0] and D[1]. The output formation 340 then performs correction based on the state of the DUE Override bit by bit-wise AND operation with the syndrome byte used for correction to suppress correction when the DUE Override bit is set.

The modified SSC-DSD+ decoder is referred to as a speed-of-light (SOL) SSC-DSD+ decoder. The key insight behind the SOL decoder is that sanity checking does not need full values to evaluate equality. Rather, the sanity checking can be performed in a redundant carry-save form, which allows for an area-efficient "carry-free modular difference equality tester," thus being faster than the SSC-DSD+ decoder of FIG. 3A. In other words, the CFMDET 350 still generates location bytes for the corresponding pairs of logarithm values, but it does so without the carry bits of the EAC subtractors 322, 324, and 336 in a manner that is more efficient. Specifically, strided differences in the form of "(b−a)==(c−b)" can be reformulated as "2*b−a−c==0", using one's complement arithmetic. The SOL SSC-DSD+ decoder saves ~20% area and achieves the minimum delay possible.

Figure 5:
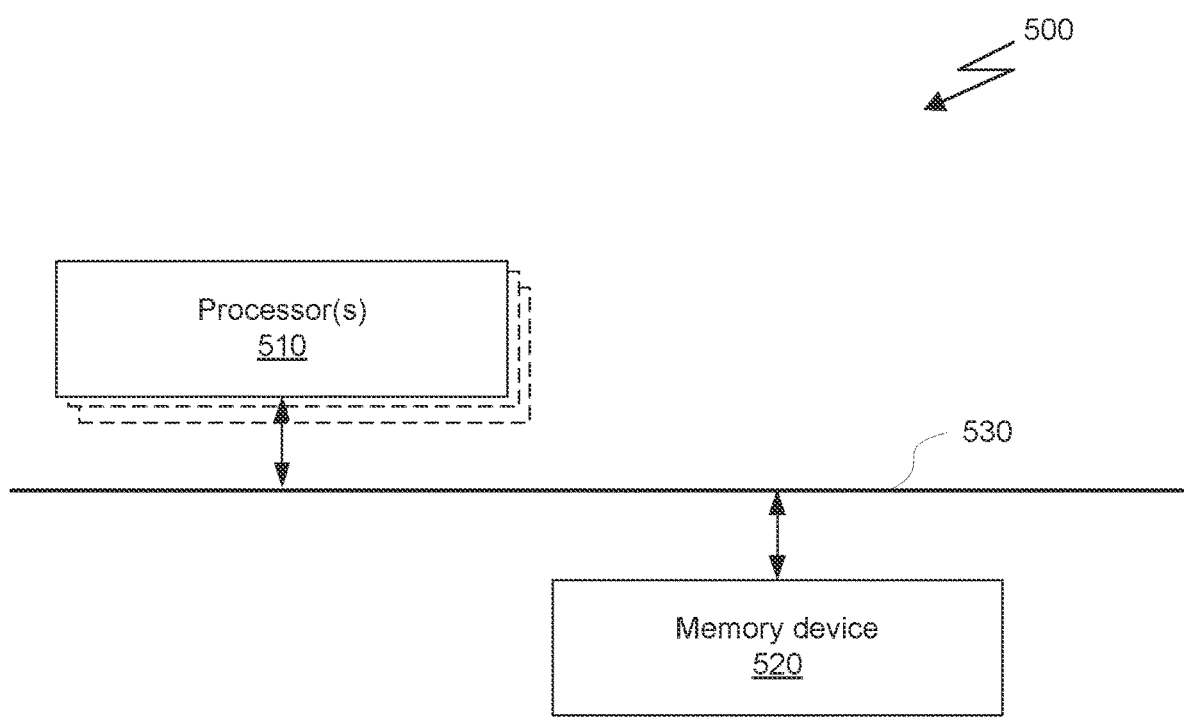
FIG. 5 illustrates a system including a memory device that implements the SSC-DSD+ scheme, in accordance with some embodiments.

FIG. 5 illustrates a system 500 including a memory device 520 that implements the SSC-DSD+ scheme or any suitable variants, in accordance with some embodiments. The memory device 520 may be connected to one or more processors 510 via a memory interface 530 in the system 500.

The processor(s) 510 may be configured to perform operations in accordance with the instructions stored in the memory device 520. The processor(s) 510 may include any appropriate type of general-purpose or special-purpose microprocessor (e.g., a CPU or a PPU/GPU, respectively), digital signal processor, microcontroller, or the like. The memory device 520 may be configured to store computer-readable instructions that, when executed by processor(s) 510, can cause the processor(s) 510 to perform various operations disclosed herein.

The memory device 520 may be a DRAM 100 as shown in FIG. 1, which includes a memory array 110 and peripheral circuits. In a further example, the memory device 520 may be configured as a high-bandwidth memory (HBM) subsystem, with multiple DRAM dies stacked within each device.

The memory interface 530 may be of various types, for example a double data rate 4/5 (DDR4/5) synchronous dynamic random access memory (SDRAM) interface for a graphics processing unit (GPU). The DDR4/5 SDRAM interface for a GPU may have 288 pins, including 64 data pins that operates in 8 cycle bursts to transfer 512 bits (64B) of data per access request. Other suitable memory interfaces may be applied herein. Each processor 510 can have a memory interface 530 including a number of pins connected to a DRAM module in the memory device 520 through, e.g., an interposer(s). The processor(s) 510 can read or write from/to the memory device 520 by sending signals over the memory interface 530. The memory device 520 then reads a cache line and performs the ECC operations described above before returning the decoded/corrected data to the processor(s) 510.

It is noted that the techniques described herein may be embodied in executable instructions stored in a computer readable medium for use by or in connection with a processor-based instruction execution machine, system, apparatus, or device. It will be appreciated by those skilled in the art that, for some embodiments, various types of computer-readable media can be included for storing data. As used herein, a "computer-readable medium" includes one or more of any suitable media for storing the executable instructions of a computer program such that the instruction execution machine, system, apparatus, or device may read (or fetch) the instructions from the computer-readable medium and execute the instructions for carrying out the described embodiments. Suitable storage formats include one or more of an electronic, magnetic, optical, and electromagnetic format. A non-exhaustive list of conventional exemplary computer-readable medium includes: a portable computer diskette; a random-access memory (RAM); a read-only memory (ROM); an erasable programmable read only memory (EPROM); a flash memory device; and optical storage devices, including a portable compact disc (CD), a portable digital video disc (DVD), and the like.

It should be understood that the arrangement of components illustrated in the attached Figures are for illustrative purposes and that other arrangements are possible. For example, one or more of the elements described herein may be realized, in whole or in part, as an electronic hardware component. Other elements may be implemented in software, hardware, or a combination of software and hardware. Moreover, some or all of these other elements may be combined, some may be omitted altogether, and additional components may be added while still achieving the functionality described herein. Thus, the subject matter described herein may be embodied in many different variations, and all such variations are contemplated to be within the scope of the claims.

To facilitate an understanding of the subject matter described herein, many aspects are described in terms of sequences of actions. It will be recognized by those skilled in the art that the various actions may be performed by specialized circuits or circuitry, by program instructions being executed by one or more processors, or by a combination of both. The description herein of any sequence of actions is not intended to imply that the specific order described for performing that sequence must be followed. All methods described herein may be performed in any suitable order unless otherwise indicated herein or otherwise clearly contradicted by context.

The use of the terms "a" and "an" and "the" and similar references in the context of describing the subject matter (particularly in the context of the following claims) are to be construed to cover both the singular and the plural, unless otherwise indicated herein or clearly contradicted by context. The use of the term "at least one" followed by a list of one or more items (for example, "at least one of A and B") is to be construed to mean one item selected from the listed items (A or B) or any combination of two or more of the listed items (A and B), unless otherwise indicated herein or clearly contradicted by context. Furthermore, the foregoing description is for the purpose of illustration only, and not for the purpose of limitation, as the scope of protection sought is defined by the claims as set forth hereinafter together with any equivalents thereof. The use of any and all examples, or exemplary language (e.g., "such as") provided herein, is intended merely to better illustrate the subject matter and does not pose a limitation on the scope of the subject matter unless otherwise claimed. The use of the term "based on" and other like phrases indicating a condition for bringing about a result, both in the claims and in the written description, is not intended to foreclose any other conditions that bring about that result. No language in the specification should be construed as indicating any non-claimed element as essential to the practice of the invention as claimed.

What is claimed is:

1. A memory device comprising a memory array and peripheral circuits coupled to the memory array, the peripheral circuits comprising logic to decode a Reed-Solomon (RS) codeword read from the memory array in response to a signal received via a memory interface by:
    calculating four syndrome symbols in accordance with the RS codeword, wherein each syndrome symbol comprises eight bits;
    determining three location bytes in accordance with three corresponding pairs of syndrome symbols in the four syndrome symbols;
    comparing the three location bytes;
    generating an output for the RS codeword based on the comparison of the three location bytes, wherein:
        the output includes corrected data responsive to determining that the three location bytes match;
        the output includes an indication of a detected-and-corrected error (DCE) responsive to determining that two of the three location bytes match; or
        the output includes an indication of a detected-yet-uncorrected error (DUE) responsive to determining that none of the three location bytes match; and
    transmitting the output to a processor connected to the memory device via the memory interface.

2. The memory device of claim 1, wherein the logic comprises:
    four discrete logarithm logic circuits, each discrete logarithm logic circuit configured to generate, via a logarithm operation, a result byte based on a corresponding syndrome symbol; and
    three end-around-carry (EAC) subtractors, each EAC subtractor configured to generate, via a subtraction operation, a corresponding location byte based on a corresponding pair of result bytes from two of the four discrete logarithm logic circuits.

3. The memory device of claim 1, wherein the RS codeword is 36 bytes and includes information for a 32 byte data word.

4. The memory device of claim 1, wherein the RS codeword is 68 bytes and includes information for a 64 byte data word.

5. The memory device of claim 1, wherein the output includes the indication of the DCE and corrected data that has been corrected based on error locations indicated by the two matching location bytes.

6. The memory device of claim 1, wherein the comparison of the three location bytes is performed by a carry-free modular difference equality tester (CFMDET) circuit.

7. The memory device of claim 1, wherein the memory device is a dynamic random access memory (DRAM) device.

8. The memory device of claim 7, wherein the memory device is coupled to a parallel processing unit.

9. A system, comprising:
    at least one processor; and
    a memory device connected to the processor via a memory interface and configured to store data using a single symbol correction, double symbol detection (SSC-DSD+) error correction code (ECC) encoding scheme, the memory device comprising a memory array and peripheral circuits coupled to the memory array, the peripheral circuits comprising logic to decode a Reed-Solomon (RS) codeword read from the memory array in response to a signal received via the memory interface by:
    calculating four syndrome symbols in accordance with the RS codeword, wherein each syndrome symbol comprises eight bits;
    determining three location bytes in accordance with three corresponding pairs of syndrome symbols in the four syndrome symbols;
    comparing the three location bytes;
    generating an output for the RS codeword based on the comparison of the three location bytes, wherein:
        the output includes corrected data responsive to determining that the three location bytes match;
        the output includes an indication of a detected-and-corrected error (DCE) responsive to determining that two of the three location bytes match; or the output includes an indication of a detected-yet-uncorrected error (DUE) responsive to determining that none of the three location bytes match; and transmitting the output to the at least one processor connected to the memory device via the memory interface.

10. The system of claim 9, wherein the logic comprises:

four discrete logarithm logic circuits, each discrete logarithm logic circuit configured to generate, via a logarithm operation, a result byte based on a corresponding syndrome symbol; and three end-around-carry (EAC) subtractors, each EAC subtractor configured to generate, via a subtraction operation, a corresponding location byte based on a corresponding pair of result bytes from two of the four discrete logarithm logic circuits.

11. The system of claim 9, wherein the RS codeword is 36 bytes and includes information for a 32 byte data word.

12. The system of claim 9, wherein the RS codeword is 68 bytes and includes information for a 64 byte data word.

13. The system of claim 9, wherein the output includes the indication of the DCE and corrected data that has been corrected based on error locations indicated by the two matching location bytes.

14. The system of claim 9, wherein the comparison of the three location bytes is performed by a carry-free modular difference equality tester (CFMDET) circuit.

15. The system of claim 9, wherein the memory device is a dynamic random access memory (DRAM) device.

16. The system of claim 9, wherein the memory device is coupled to a parallel processing unit.

17. The system of claim 9, wherein the memory interface comprises a double data rate 4 (DDR4) or double data rate 5 (DDR5) synchronous dynamic random access (SDRAM) memory interface.

* * * * *